(12) United States Patent
Akram (10) Patent No.: US 7,049,206 B2
(45) Date of Patent: May 23, 2006

(54) DEVICE ISOLATION FOR SEMICONDUCTOR DEVICES

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/851,150

(22) Filed: May 21, 2004

(65) Prior Publication Data

US 2004/0214403 A1 Oct. 28, 2004

Related U.S. Application Data

(62) Division of application No. 09/733,418, filed on Dec. 8, 2000, now abandoned, which is a division of application No. 09/079,212, filed on May 14, 1998, now Pat. No. 6,175,147.

(51) Int. Cl.
*H01L 21/76* (2006.01)

(52) U.S. Cl. .................. 438/427; 438/437; 438/445

(58) Field of Classification Search ............... 438/400, 438/404, 405, 424, 425, 427, 430–431, 443–446
See application file for complete search history.

(56) References Cited

U.S. PATENT DOCUMENTS

| 4,045,249 | A | | 8/1977 | Hotta | 438/362 |
|---|---|---|---|---|---|
| 4,240,095 | A | | 12/1980 | Rossetti | 257/496 |
| 4,471,525 | A | | 9/1984 | Sasaki | 438/431 |
| 4,472,240 | A | * | 9/1984 | Kameyama | 438/427 |
| 4,495,025 | A | | 1/1985 | Haskell | 438/427 |
| 4,570,325 | A | | 2/1986 | Higuchi | 438/433 |
| 4,639,288 | A | | 1/1987 | Price et al. | 438/430 |
| 4,685,198 | A | * | 8/1987 | Kawakita et al. | 438/410 |
| 4,922,318 | A | | 5/1990 | Thomas et al. | 257/370 |
| 4,965,221 | A | | 10/1990 | Dennison et al. | 438/443 |
| 5,051,795 | A | | 9/1991 | Gill et al. | 257/317 |
| 5,087,586 | A | | 2/1992 | Chan et al. | 438/429 |
| 5,319,235 | A | | 6/1994 | Kihara et al. | 257/370 |
| 5,393,692 | A | * | 2/1995 | Wu | 438/446 |
| 5,465,003 | A | | 11/1995 | Lur et al. | 257/510 |
| 5,646,052 | A | | 7/1997 | Lee | 438/426 |
| 5,679,599 | A | | 10/1997 | Mehta | 438/425 |
| 5,747,866 | A | | 5/1998 | Ho et al. | 257/506 |
| 5,895,253 | A | | 4/1999 | Akram | 438/424 |
| 5,904,540 | A | * | 5/1999 | Sheng et al. | 438/427 |
| 5,916,823 | A | * | 6/1999 | Lou et al. | 438/738 |
| 5,972,777 | A | | 10/1999 | Hsu et al. | 438/440 |
| 5,976,950 | A | * | 11/1999 | DiSimone et al. | 438/432 |
| 6,054,343 | A | * | 4/2000 | Ashburn | 438/221 |
| 6,111,319 | A | | 8/2000 | Liou et al. | 257/758 |
| 6,137,152 | A | | 10/2000 | Wu | 257/510 |
| 6,175,147 | B1 | * | 1/2001 | Akram | 257/647 |
| 6,326,314 | B1 | * | 12/2001 | Merrill et al. | 438/750 |

FOREIGN PATENT DOCUMENTS

| JP | 361287233 | 12/1985 | 438/427 |
|---|---|---|---|
| JP | 1099230 | 4/1989 | 438/227 |

* cited by examiner

*Primary Examiner*—Chandra Chaudhari
(74) *Attorney, Agent, or Firm*—David J. Paul (57) ABSTRACT

Exemplary embodiments of the present invention disclose a semiconductor assembly having at least one isolation structure formed. The semiconductor assembly comprises: a first trench in a semiconductive substrate; a second trench extending the overall trench depth in the semiconductive substrate by being aligned to the first trench; and an insulation material substantially filling the first and second trenches. The isolation structure separates a non-continuous surface of a conductive region.

9 Claims, 8 Drawing Sheets

DEVICE ISOLATION FOR SEMICONDUCTOR DEVICES

This application is a divisional to U.S. patent application Ser. No. 09/733,418, filed Dec. 8, 2000 now abandoned, which is a divisional to U.S. patent application Ser. No. 09/079,212, now U.S. Pat. No. 6,175,147 B1, filed May 14, 1998.

FIELD OF THE INVENTION

This invention relates to semiconductor fabrication processing and more particularly to a method for forming isolation for Complimentary Metal Oxide Semiconductor (CMOS) devices.

BACKGROUND OF THE INVENTION

The continuing trend of scaling down integrated circuits has forced the semiconductor industry to consider new techniques for fabricating smaller components at sub-micron levels. With the industry moving towards processes for fabrication of smaller device geometries, isolation between devices becomes a very critical issue.

Several isolation methods are currently prevalent in the semiconductor industry. One method, LOCal Oxidation of Silicon (LOCOS) uses patterned silicon nitride as an oxidation inhibitor so that the silicon substrate will oxidize where the nitride is removed and not oxidize where the nitride is present. A main fabrication concern when using LOCOS is the encroachment of oxide under the nitride that causes the well known "bird's-beak" problem.

A second isolation method is deep trench isolation, where a single deep trench is etched into the silicon substrate and then filled with oxide. However, deep trenches have proven difficult to reliably manufacture over an entire wafer and the width of the trench is limited to the critical dimension of a given process.

The present invention develops a method to fabricate device isolation for sub-micron fabrication processes. In particular, the present invention provides a device isolation method for processes using a device geometry of 0.18 μm or smaller.

SUMMARY OF THE INVENTION

An exemplary implementation of the present invention discloses an isolation structure and processes for fabricating the isolation structure for a semiconductor device.

In a general aspect of the present invention, a semiconductor assembly having at least one isolation structure is formed. The semiconductor assembly may simply comprise a trench in a semiconductive substrate, the trench being filled with an insulation material. In a preferred general embodiment, the semiconductor assembly comprises: a first trench in a semiconductive substrate; a second trench extending the overall trench depth in the semiconductive substrate by being aligned to the first trench; and an insulation material substantially filling the first and second trenches. The isolation structure separates a non-continuous surface of a conductive region.

General process steps to form the isolation structure comprise: forming a mask over a semiconductor substrate assembly; forming a first trench into the semiconductor substrate assembly using the mask as an etching guide; forming an insulation layer on the surface of the first trench; forming a semiconductive spacer on the side wall of the first trench; forming a second trench into the semiconductor substrate assembly at the bottom of the first trench by using the semiconductive spacer as an etching guide; forming an isolation filler in the first and second trenches, the isolation filler substantially consuming the semiconductive spacer and thereby substantially filling the first and second trenches; and planarizing the isolation filler. If sufficient for a given process, the steps to form a second trench could be skipped and the isolation filler would then be formed in a first trench.

BRIEF DESCRIPTION OF THE DRAWINGS

FIG. 2I is an expanded cross-sectional view taken from FIG. 2H showing the isolation structure in relationship to bordering transistor devices.

DETAILED DESCRIPTION OF THE INVENTION

Exemplary implementations of the present invention are directed to an isolation structure and a process for forming semiconductor device isolation as depicted in the embodiments of FIGS. 1A–1H and FIGS. 2A–2I.

Figure 1A:
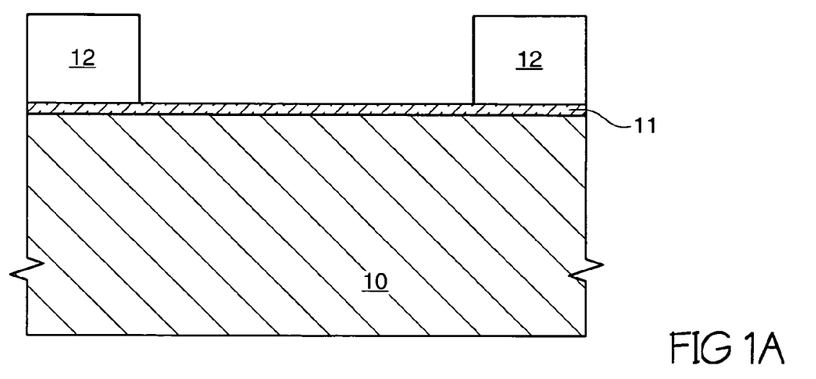
FIG. 1A is a cross-sectional view depicting a semiconductor substrate covered with a first insulation layer and a patterned masking material.

Referring to FIG. 1A, a semiconductive substrate 10, such as a silicon wafer, is prepared for the processing steps of the present invention. A first insulation layer 11, such as oxide, covers the surface of semiconductive substrate 10. It is preferred to form the oxide by growing the oxide on the semiconductive substrate. A masking material 12, such as photoresist, is patterned over semiconductive substrate 10 leaving an exposed portion of insulation layer 11.

Figure 1B:
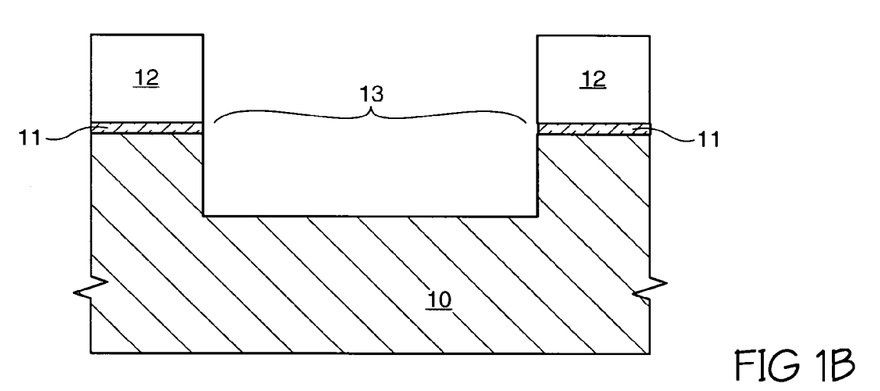
FIG. 1B is a subsequent cross-sectional view taken from FIG. 1A depicting an etching step that forms a first trench into the semiconductive substrate.

Referring now to FIG. 1B, an anisotropic etch is performed that etches through the exposed portion of insulation layer 11 and continues into the semiconductive substrate 10 to form a first trench 13 therein. The desired depth of first trench 13 is discussed further in the process steps.

Figure 1C:
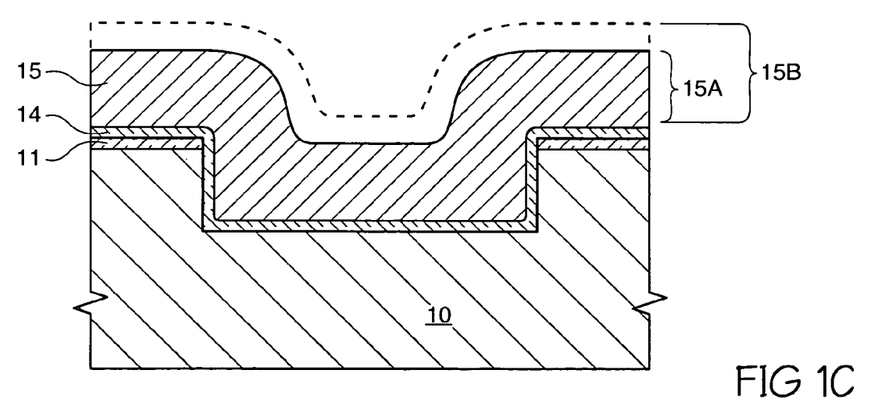
FIG. 1C is a subsequent cross-sectional view taken from FIG. 1B depicting the removal of the patterned masking layer, the formation of a second insulation layer and the formation of a semiconductive layer.

Referring now to FIG. 1C, the masking material 12 is stripped from the substrate's surface. Next, a second insulation layer 14 is formed over the remaining first insulation layer 11 and next to first trench 13. The second insulation layer 14 may be oxide formed by subjecting the trenched area of the substrate to oxidation. Next, conformal layer of semiconductive material 15, such as polysilicon, is deposited on the second insulation layer 14. The thickness of semiconductive material 15, represented by either forming the layer to thickness 15A or 15B, will determine the width of a subsequently etched trench. It is preferred that semiconductive material 15 be approximately one fourth (or less) the width of first trench 13. This ratio will enable the formation of a subsequently formed second trench to a desired width. Also, material 15 may be any material that is oxidizable with silicon being the preferred material, as most semiconductor processes and particularly DRAM processes readily use silicon.

Figure 1D:
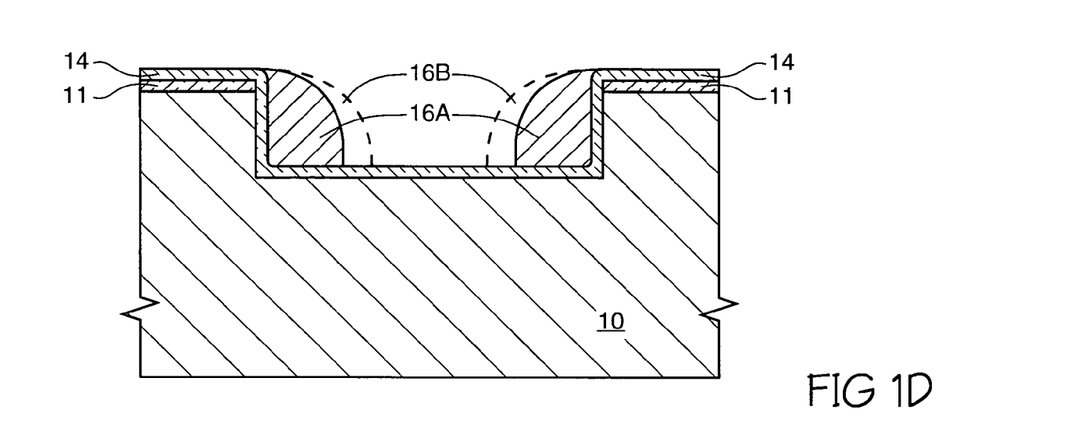
FIG. 1D is a subsequent cross-sectional view taken from FIG. 1C depicting an etching step to form semiconductive spacers on the wall of the first trench.

Referring now to FIG. 1D, semiconductive material 15 is anisotropically etched to remove the material from the bottom of trench 13 and simultaneously from the upper surface of the substrate. This anisotropic etch will leave behind semiconductive material spacer 16A or 16B (again depending on the thickness of semiconductive material 15) on the side wall of first trench 13, expose portions of insulation layer 14 at the bottom of first trench 13 and also expose portions on the upper surface of the substrate. During this anisotropic etch (or spacer etch in this case), as semiconductive material spacer 16A or 16B is formed, the spacer etch will completely clear the semiconductive material from the non-trenched wafer surface as well as clear the material from a portion of wafer surface at the bottom of the trench. The semiconductive material spacer (16A or 16B) is easily formed as an anisotropic etch basically removes material in a generally vertical direction and thereby leaves behind a vertical spacer that lines the wall along the circumference of first trench 13 and removes semiconductive material at the bottom of first trench 13.

Figure 1E:
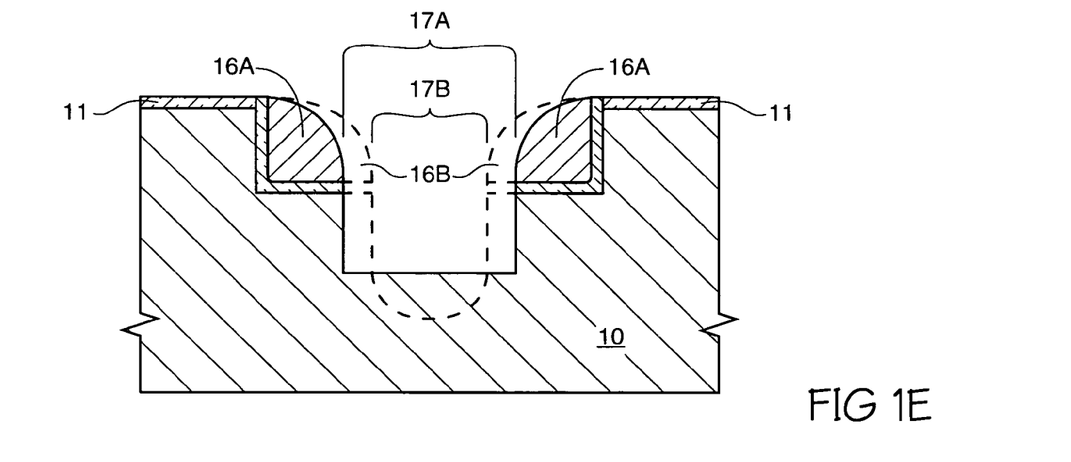
FIG. 1E is a subsequent cross-sectional view taken from FIG. 1D depicting a second etching step to form a second trench into the semiconductive substrate.

Referring now to FIG. 1E, an anisotropic etch (either the continuation of the previous anisotropic spacer etch described in FIG. 1D or a separate anisotropic etch) is performed that etches into the substrate using the semiconductive material spacer (16A or 16B) as a self-aligning guide. This etch will also remove more of the spacer material, however a desired trench depth is easily reached while a substantial portion of the spacer material remains intact. Note, as stated previously, the thickness of the spacer can easily be used to define the trench opening and thus the width and depth of the trench (as shown in FIG. 1E).

Figure 1F:
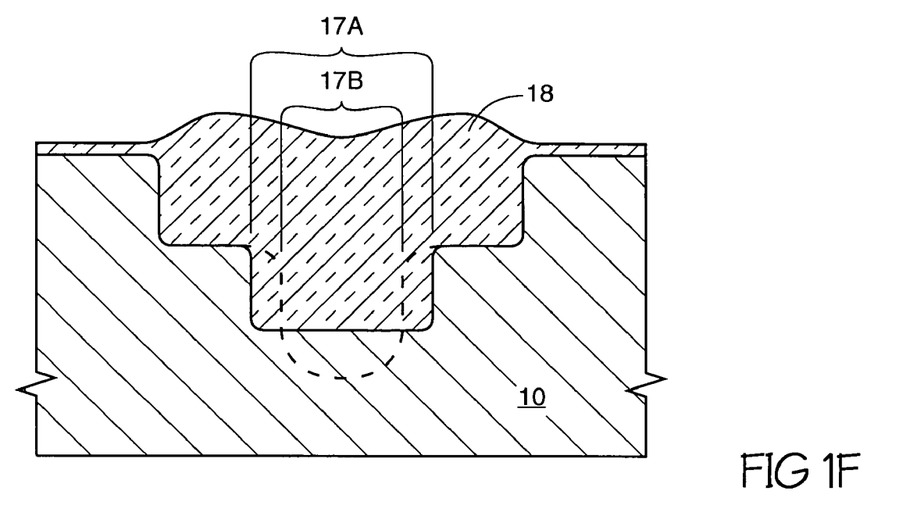
FIG. 1F is a subsequent cross-sectional view taken from FIG. 1E depicting the formation of an isolation material that consumes the semiconductive spacers and fills both the first and second substrate trenches.

Referring now to FIG. 1F, isolation material 18 is formed such that it consumes the semiconductive spacer (16A or 16B), insulation layer 14 and fills both the first and second substrate trenches (13 and 17A or 17B). In order to form isolation material 18, it is preferred to anneal the entire semiconductor assembly in a furnace while providing an oxidizing agent to the semiconductor assembly. In a preferred embodiment, the semiconductive substrate is silicon and the semiconductive spacer is polysilicon. Polysilicon will oxidize at a faster rate than the silicon substrate, so the oxidation of the silicon substrate along the edges of the trench is minimized by the time the polysilicon is substantially (completely) oxidized. Isolation material 18 may also be formed by the deposition of oxide to fill the trenches.

Figure 1G:
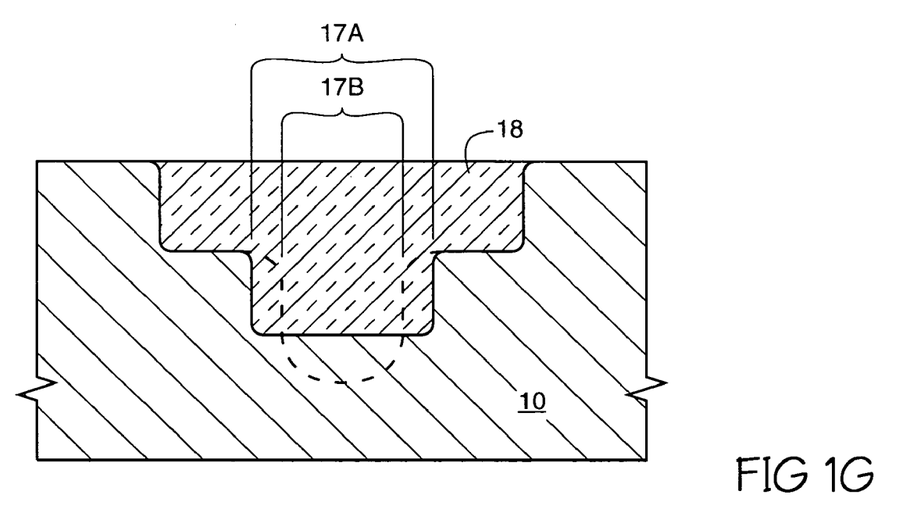
FIG. 1G is a subsequent cross-sectional view taken from FIG. 1F showing the isolation material after planarization.
Figure 1H:
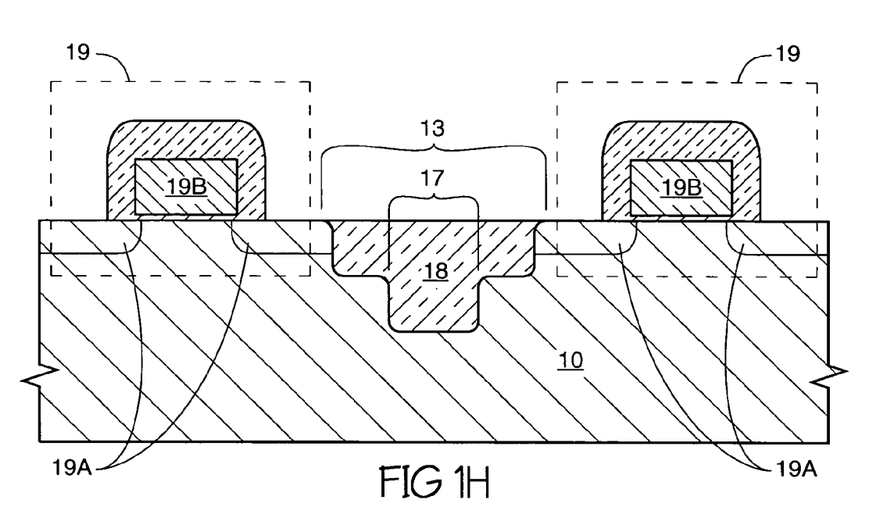
FIG. 1H is an expanded cross-sectional view taken from FIG. 1F showing the isolation structure in relationship to bordering transistor devices.

At this point in the process, and referring now to FIG. 1G, isolation material 18 may be planarized to substantially reduce or possibly even eliminate any encroachment of isolation material 18 at the upper corners of first trench 13. This planarization step would also prepare the semiconductor assembly for further processing, such as for transistor formation. In this embodiment, chemical mechanical planarization (CMP) is preferred as there are no etch stop layers available to facilitate use of an etch to planarize isolation material 18.

FIG. 1G shows a relationship between the formed isolation structure 18 and bordering transistors 19. Transistors 19 comprise of transistor gates 19B bridging across diffusion regions 19A. This view demonstrates the importance of second trench 17 to obtain effective isolation between transistors 19. It is preferred that the overall depth of first trench 13 and second trench 17 be two times the depth of diffusion region 19A. Diffusion region 19A is considered to be the area containing at least approximately 90% concentration of the implanted conductive atoms.

Figure 2A:
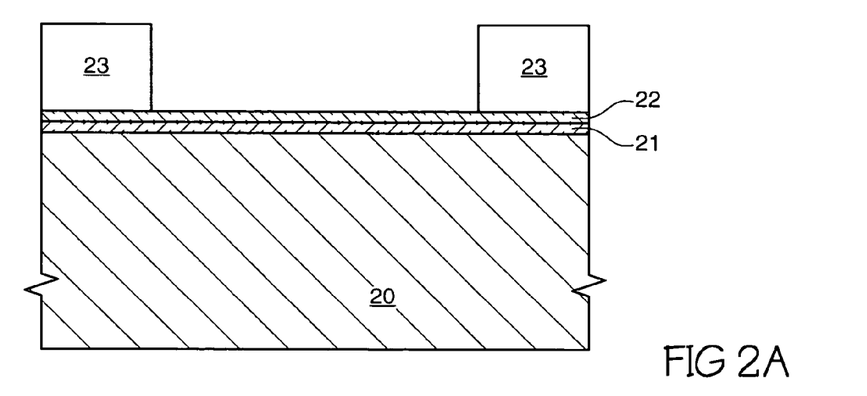
FIG. 2A is a cross-sectional view depicting a semiconductor substrate covered with a first insulation layer and a patterned masking material.

A second exemplary implementation of the present invention is depicted in FIGS. 2A–2G. Referring to FIG. 2A, a semiconductive substrate 20, such as a silicon wafer, is prepared for the processing steps of the present invention. A first insulation layer 21 (i.e., a dielectric material such as oxide), is formed over the surface of semiconductive substrate 20. It is preferred to form the oxide by growing the oxide on the semiconductive substrate. A second insulation layer 22 (i.e., a dielectric material such as nitride) is formed over the first insulation layer 21. A masking material 23, such as photoresist, is patterned over semiconductive substrate 20 leaving an exposed portion of insulation layer 22.

Figure 2B:
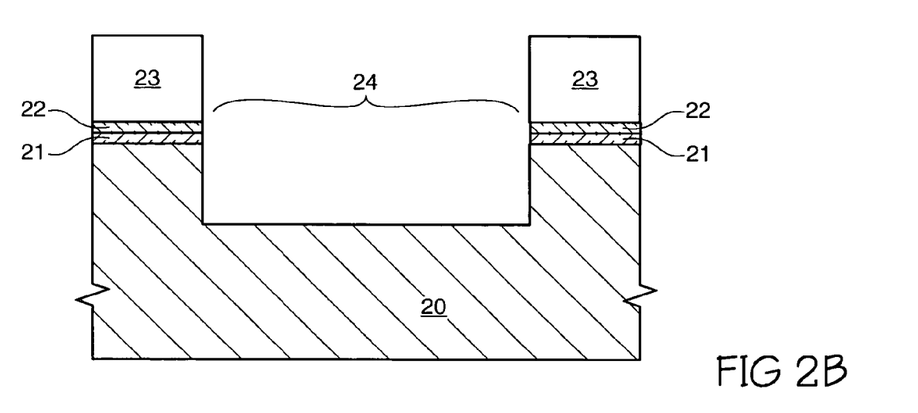
FIG. 2B is a subsequent cross-sectional view taken from FIG. 2A depicting an etching step that forms a first trench into the semiconductive substrate.

Referring now to FIG. 2B, an anisotropic etch is performed that etches through the exposed portion of insulation layer 22, through insulation layer 21 and continues into the semiconductive substrate 20, creating a first trench 24 therein. The desired depth of first trench 24 is discussed further in the process steps.

Figure 2C:
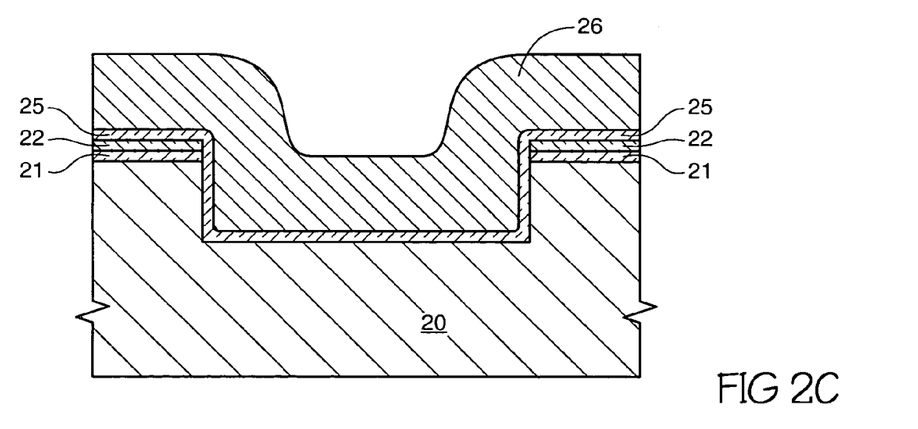
FIG. 2C is a subsequent cross-sectional view taken from FIG. 2B depicting the removal of the patterned masking layer, the formation of a second insulation layer and the formation of a semiconductive layer.

Referring now to FIG. 2C, the masking material 23 is stripped from the substrate's surface. Next, a third insulation layer 25 (i.e., a dielectric material, such as oxide or nitride) is formed over the remaining second insulation layer 22 and next to the first trench 24 in substrate 20. (The significance of the material selected for third insulation layer 25 will become apparent from the discussion of FIGS. 2G and 2H.) Next, a conformal layer of dielectric material 26, such as oxide, is deposited on third insulation layer 25. As taught in the embodiment of FIGS. 1A–1H, the thickness of material 26 will determine the width and depth of a second trench to be subsequently formed.

Figure 2D:
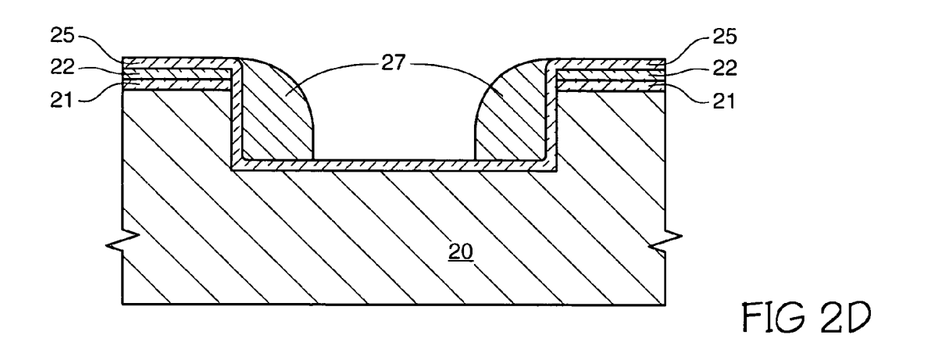
FIG. 2D is a subsequent cross-sectional view taken from FIG. 2C depicting an etching step to form a semiconductive spacer on the wall of the first trench.

Referring now to FIG. 2D, the conformal layer of dielectric material 26 is anisotropically etched to remove the material from the bottom of the trench and consequently from the upper surface of the substrate. This anisotropic etch will leave behind dielectric material spacer 27 which lines the wall along the circumference of first trench 24, expose portions of insulation layer 24 at the bottom of the first trench and also expose portions on the upper surface of the substrate. During this anisotropic etch (or spacer etch in this case), as dielectric material spacer 27 is formed the spacer etch will completely clear the dielectric material from the non-trenched wafer surface, remove the now exposed portion of insulation layer 25 and also clear the material from a portion of wafer surface at the bottom of the trench. Dielectric material spacer 27 is easily formed as an anisotropic etch basically removes material in a generally vertical direction and thereby leaves behind a vertical spacer while the etch clears the semiconductive material at the bottom of the first trench.

Figure 2E:
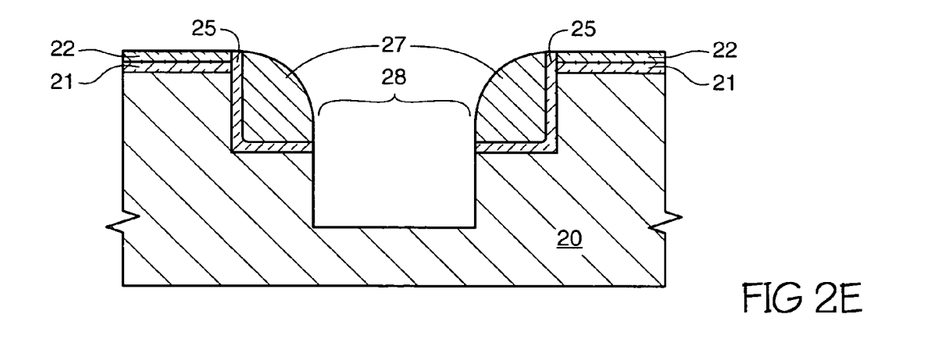
FIG. 2E is a subsequent cross-sectional view taken from FIG. 2D depicting a second etching step to form a second trench into the semiconductive substrate.

Referring now to FIG. 2E, an anisotropic etch (either the continuation of the previous anisotropic spacer etch described in FIG. 2D or a separate anisotropic etch) is performed that etches into the substrate using the dielectric material spacer 27 as a self-aligning guide, to form a second trench 28. This etch will also remove more of the spacer material, however a desired trench depth is easily reached while a substantial portion of the spacer material remains intact. The width of second trench 28 can be controlled by the depth of dielectric material layer 26.

Figure 2F:
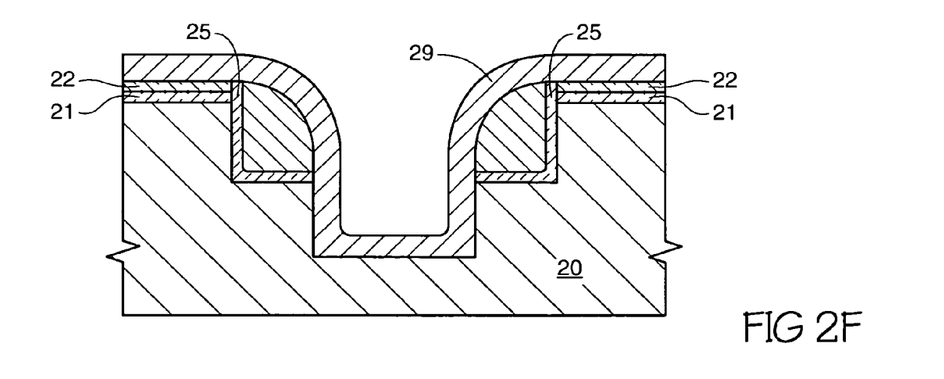
FIG. 2F is a subsequent cross-sectional view taken from FIG. 2E, following the formation of a conformal polysilicon layer into the first and second trenches.

An optional step is depicted in FIG. 2F which shows the formation of a second conformal layer of semiconductive material 29 that covers the remaining portion of second insulating 22, dielectric material spacers 27 and the wall and bottom surface of second trench 28. The addition of semiconductive material 29 will provide additional oxidizable material for the following step.

Figure 2G:
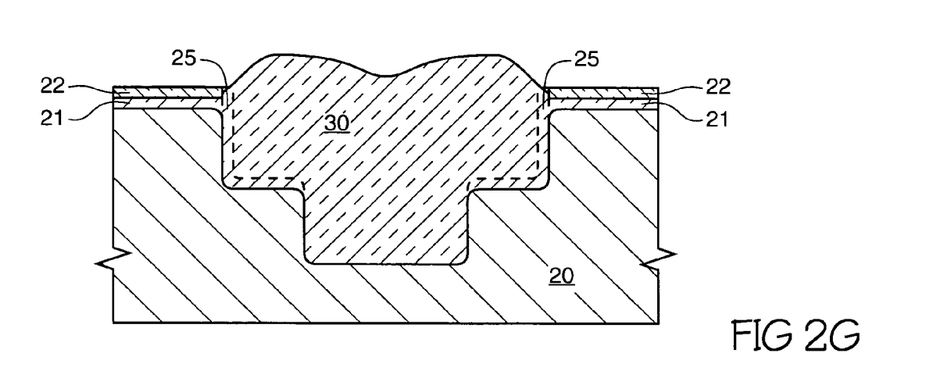
FIG. 2G is a subsequent cross-sectional view taken from FIG. 2F depicting the formation of an isolation material that consumes the semiconductive spacer, conformal polysilicon (if present) and fills both the first and second substrate trenches.

Referring now to FIG. 2G, isolation material 30 is formed such that it consumes semiconductive material 29 (if present) and fills both the first and second substrate trenches 24 and 30. In this embodiment, if third insulation layer 25 is substantially non-oxidizable, such as a nitride of the semiconductive material (i.e., silicon nitride is effective as it is non-receptive to oxidation) and is chemically different than the first insulation layer and the (nitride) lining of first trench 24 will prevent further oxidation of the semiconductive material about the wall of the first trench region. If the third insulation layer 25 is oxide, it will become part of isolation region 30. In order to form isolation material 30, it is preferred to anneal the entire semiconductor assembly in a furnace while in the presence of an oxidizing agent. Isolation material 30 may also be formed by the deposition of oxide to fill the trenches.

Figure 2H:
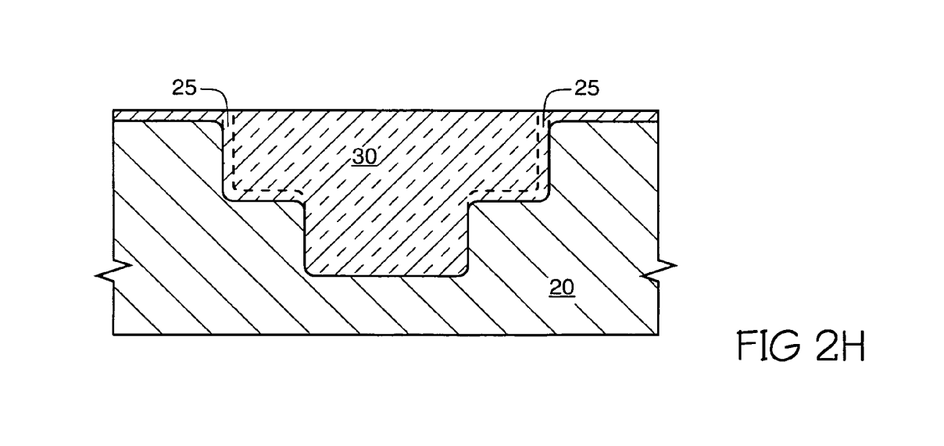
FIG. 2H is a subsequent cross-sectional view taken from FIG. 2G showing the isolation material after planarization.

Referring now to FIG. 2H, isolation material 30 may be planarized by using the remaining portion of insulating layer 22 as an etch stop. Then the remaining portion of insulating layer 22 is removed to leave a planar surface for processing the semiconductor assembly further, such as for transistor formation. The planarization of isolation material 30 will substantially reduce or possibly eliminate any encroachment of isolation material 30 at the upper corners of first trench 24. In this embodiment, planarization of isolation material 30 by etching is preferred as there is an etch stop layer (layer 25) available to use.

FIG. 2I shows a relationship between the formed isolation structure 30 and bordering transistors 31. Transistors 31 comprise of transistor gates 31B bridging across diffusion regions 31A. This view demonstrates the importance of second trench 28 to obtain effective isolation between transistors 31. It is preferred that the overall depth of first trench 24 and second trench 28 be two times the depth of diffusion region 31A. Diffusion region 31A is considered to be the area containing at least approximately 90% concentration of the implanted conductive atoms.

During a given fabrication process, implementation of any one of the embodiments of the present invention will provide a trench having the desired width and depth. In general, the disclosed methods can be used to make a second trench ½ to ¼ of the width of the upper (first) trench and is dependent upon materials utilized and the depth of deposition of those materials. For example, to create a second trench approximately 0.18 microns wide, the first trench would be etched to a width of approximately 0.3 microns. The semiconductive material would then be formed over the substrate's surface at a thickness of approximately 0.06 microns. After the spacer etch is performed, the resulting spacer formed on the sidewall of the first trench would be approximately 0.06 microns wide. Then using the spacer as an etching guide to form the second trench (as described in the above embodiments) the subsequent anisotropic etch would result in a second trench having a width of approximately 0.18 microns.

It is to be understood that although the present invention has been described with reference to several preferred embodiments, various modifications, known to those skilled in the art, such as utilizing the disclosed methods to form sub-resolution contracts, may be made to the structures and process steps presented herein without departing from the invention as recited in the several claims appended hereto.

What is claimed is:

1. A process for forming device isolation for a semiconductor assembly comprising:
    forming a first trench having sidewalls into a semiconductor substrate;
    forming a single dielectric layer lining a surface of the first trench;
    forming spacers of oxidizable material along the sidewalls of the first trench over and in direct contact with the single dielectric layer;
    forming a second trench into the semiconductor substrate at the bottom of the first trench using the spacers as an etching guide, wherein an overall depth of the first and second trenches is two times a depth of a bordering diffusion region determined by an area containing at least 90% concentration of conductive atoms;
    forming an insulative material in the first and second trenches at least partially by substantially consuming the oxidizable material of the spacers.

2. The process as recited in claim 1, wherein forming the insulative material comprises annealing the semiconductor assembly in the presence of an oxidizing agent.

3. The process as recited in claim 1, wherein said process uses only one mask to form the device isolation.

4. A process for forming device isolation for a semiconductor assembly comprising:
    forming a first trench having sidewalls into a semiconductor substrate;
    forming a single dielectric layer lining a surface of the first trench;
    forming dielectric spacers along the sidewalls of the first trench over and in direct contact with the single dielectric layer;
    forming a second trench into the semiconductor substrate at the bottom of the first trench using the spacers as an etching guide, wherein an overall depth of the first and second trenches is two times a depth of a bordering diffusion region determined by an area containing at least 90% concentration of conductive atoms;

forming a semiconductive material layer that overlies the dielectric spacers and lines the second trench; and forming an insulative material in the first and second trenches at least partially by substantially consuming the dielectric spacers and the semiconductive material layer.

5. The process as recited in claim 4, wherein forming the insulative material comprises annealing the semiconductor assembly in the presence of an oxidizing agent.

6. The process as recited in claim 4, wherein the process uses only one mask to form the device isolation.

7. A process for forming device isolation for a semiconductor assembly comprising:

forming a first trench having sidewalls into a semiconductor substrate;

forming a single nitride layer lining a surface of the first trench;

forming oxide spacers along the sidewalls of the first trench over and in direct contact with the single nitride layer;

forming a second trench into the semiconductor substrate at the bottom of the first trench using the spacers as an etching guide, wherein an overall depth of the first and second trenches is two times a depth of a bordering diffusion region determined by an area containing at least 90% concentration of conductive atoms;

forming a semiconductive material layer that overlies the oxide spacers and lines the second trench;

forming an oxide filler in the first and second trenches at least partially by substantially consuming the oxide spacers and the semiconductive material layer; and planarizing the oxide filler.

8. The process as recited in claim 7, wherein forming the oxide filler comprises annealing the semiconductor assembly in the presence of an oxidizing agent.

9. The process as recited in claim 7, wherein the process uses only one mask to form the device isolation.

* * * * *